(12) United States Patent
Martin

(10) Patent No.: US 9,120,578 B2
(45) Date of Patent: Sep. 1, 2015

(54) GUIDANCE APPARATUS OF A TANKER AIRCRAFT

(71) Applicant: EADS Construcciones Aeronauticas S.A., Getafe (ES)

(72) Inventor: Ignacio Yague Martin, Getafe (ES)

(73) Assignee: EADS Construcciones Aeronauticas S.A., Getafe (ES)

( * ) Notice: Subject to any disclaimer, the term of this patent is extended or adjusted under 35 U.S.C. 154(b) by 239 days.

(21) Appl. No.: 13/787,226

(22) Filed: Mar. 6, 2013

(65) Prior Publication Data

US 2013/0264426 A1    Oct. 10, 2013

(30) Foreign Application Priority Data

Mar. 7, 2012  (EP) ..................... 12382085

(51) Int. Cl.
- *G08B 21/00* (2006.01)
- *B64D 39/00* (2006.01)
- *B64D 47/06* (2006.01)
- *G01R 31/00* (2006.01)
- *H05B 37/02* (2006.01)

(52) U.S. Cl.
CPC ............... *B64D 39/00* (2013.01); *B64D 47/06* (2013.01); *G01R 31/00* (2013.01); *H05B 37/02* (2013.01)

(58) Field of Classification Search
CPC ......... H05B 37/02; H05B 31/00; G01R 31/11
USPC .............................. 315/77, 307, 246; 244/130
See application file for complete search history.

(56) References Cited

U.S. PATENT DOCUMENTS

| | | | |
|---|---|---|---|
| 6,935,595 | B2 | 8/2005 | Butsch et al. |
| 2005/0103938 | A1* | 5/2005 | Butsch et al. ................. 244/130 |
| 2008/0074409 | A1 | 3/2008 | Lehmann |
| 2009/0140099 | A1 | 6/2009 | Roberts et al. |
| 2010/0090618 | A1* | 4/2010 | Veltman ........................ 315/307 |
| 2013/0049584 | A1* | 2/2013 | Munari et al. .................. 315/77 |

FOREIGN PATENT DOCUMENTS

WO    2011039678    4/2011

OTHER PUBLICATIONS

European Search Report, Aug. 2, 2012.

* cited by examiner

*Primary Examiner* — Shirley Lu
(74) *Attorney, Agent, or Firm* — Greer, Burns & Crain Ltd.

(57) ABSTRACT

A guidance apparatus mounted on the belly of a tanker aircraft for providing visual indications to the pilot of the receptor aircraft with respect to the approaching operation to carry out the refueling by means of a refueling boom. The guidance apparatus includes light emitting devices including modules of light emitting diodes and control devices for supplying current to the light emitting diodes that include dimming control units for controlling the intensity of the light emitted by the light emitting devices via a dimming signal depending on a dimming voltage. The dimming control units are adapted to provide to the light emitting devices a pulse-exponential amplitude modulated dimming signal so that the light intensity can be properly controlled in all visibility conditions.

5 Claims, 6 Drawing Sheets

GUIDANCE APPARATUS OF A TANKER AIRCRAFT

CROSS-REFERENCES TO RELATED APPLICATIONS

This application claims the benefit of the European patent application No. 12382085.4 filed on Mar. 7, 2012, the entire disclosures of which are incorporated herein by way of reference.

FIELD OF THE INVENTION

The present invention relates generally to in-flight refueling and more specifically to a guidance apparatus of a tanker aircraft for providing visual indications to the pilot of the receptor aircraft with respect to the approaching operation to carry out the refueling by means of a refueling boom.

BACKGROUND OF THE INVENTION

U.S. Pat. No. 6,935,595 and US 2009/0015436 disclose a guidance apparatus mounted on the belly of a tanker aircraft that provide visual indications to the receptor pilot to facilitate the approaching operation for carrying out a refueling operation using a refueling boom which is based on light emitting devices, called Pilot Director Lights (PDLs), comprising one or more light emitting diodes (LEDs) modules and control devices for controlling the current supplied to each LEDs module.

Said guidance apparatus includes a dimming capability for regulating the level of the light intensity of the LEDs modules that has the following drawbacks:
  The light intensity is too high for receiver pilots in night ambient conditions. This amount of light is annoying and affects the workload of receiver pilots during a refueling operation.
  When the dimming control slightly decreases below the minimum level, the LEDs modules are unexpectedly switched off. Sometimes a light flashing is noted resulting in a very annoying situation for a receiver pilot, who is blinded with this intermittent effect.

SUMMARY OF THE INVENTION

An object of the present invention is to provide a guidance apparatus of a tanker aircraft based on LEDs modules for providing visual indications to the pilot of the receptor aircraft with respect to the approaching operation to carry out the refueling by means of a refueling boom in a safe manner for the receptor pilot particularly at night.

This and another objects are met by a guidance apparatus comprising light emitting devices including modules of light emitting diodes (LEDs) and control devices for supplying current to said light emitting devices that include dimming control units for controlling the intensity of the light emitted by the light emitting devices by means of a dimming signal depending on a dimming voltage Vdim. The dimming control units are adapted to provide to the light emitting devices a pulse-exponential amplitude modulated dimming signal Vref2 so that the light intensity can be properly controlled in all visibility conditions.

In one embodiment, the dimming control unit comprises a dimming signal converter with an exponential response where an analog signal corresponding to the dimming voltage Vdim is generated and an output dimming unit where the pulse-exponential amplitude modulated dimming signal Vref2 is generated. Hereby an apparatus is achieved with an exponential control of the light intensity that allows, particularly, a good regulation of the light intensity at low levels avoiding inconveniences to the receptor pilots.

In another embodiment, the pulse-exponential amplitude modulated dimming signal Vref2 is generated adapting a prior generated pulse-width modulated dimming signal Vref1 corresponding to the dimming voltage Vdim. Hereby an apparatus is achieved with an exponential control of the light intensity that can be built up adapting known apparatus that use a pulse-width modulated dimming signal Vref1 for the control of the light intensity.

Other desirable features and advantages of the guidance apparatus according to this invention will become apparent from the subsequent detailed description of the invention and the appended claims, in relation with the enclosed drawings.

DETAILED DESCRIPTION OF THE PREFERRED EMBODIMENTS

Figure 1:
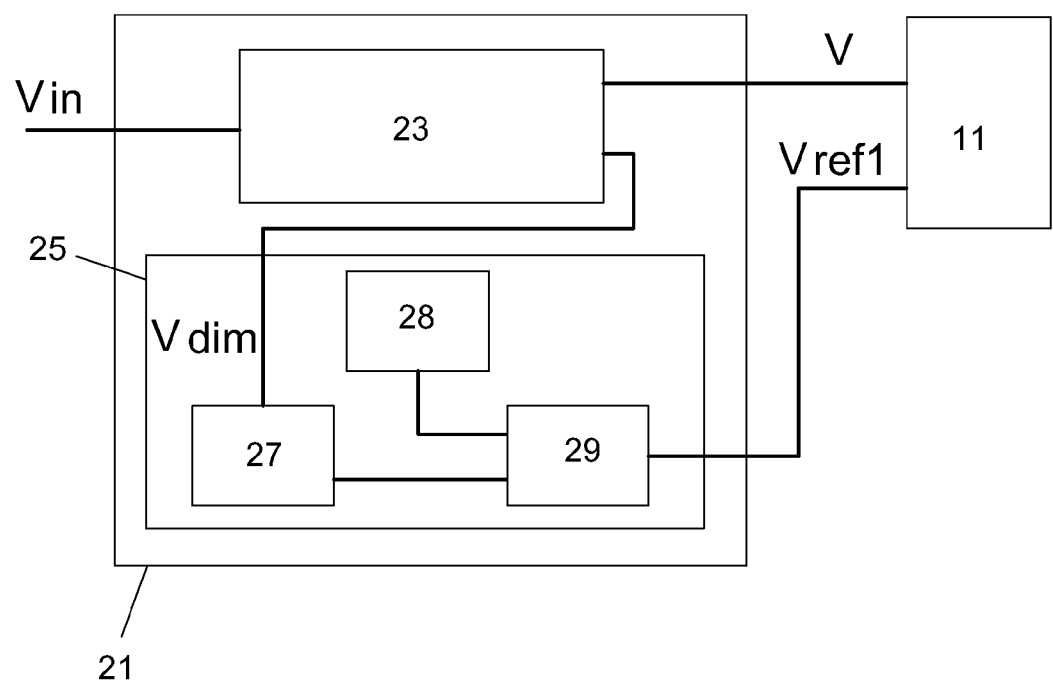
FIG. 1 is a block diagram of a known control device for controlling the current supplied to a light emitting device of a guidance apparatus of a tanker aircraft.

A control device 21 for a light emitting device 11 according to U.S. Pat. No. 6,935,595 and US 2009/0015436 is shown in FIG. 1.

The input to the control device 21 is an electromagnetically filtered DC voltage Vin and the output is the voltage V (e.g., +15 VDC) to be distributed to each LEDs module of the light emitting device 11 and the dimming signal Vref1 that controls the light intensity level of each LEDs module of the light emitting device 11.

The control device 21 comprises a power supply interface 23 and a dimming control unit 25 comprising a dimming signal converter 27, a PWM ramp generator 28 and an output dimming unit 29.

The power supply interface 23 generates the voltage V and also a dimming voltage Vdim (e.g. ±5 VDC) to be sent to the dimming signal converter 27.

The output dimming unit 29 receives the converted analog voltage corresponding to the dimming voltage Vdim as well as a signal generated by the PWM ramp generator 29 in order to output a modulated square wave PWM signal Vref1. The duty cycle of this square wave PWM output signal Vref1 is dependent upon the magnitude of the analog signal generated by the dimming signal converter 27.

Figure 2A:
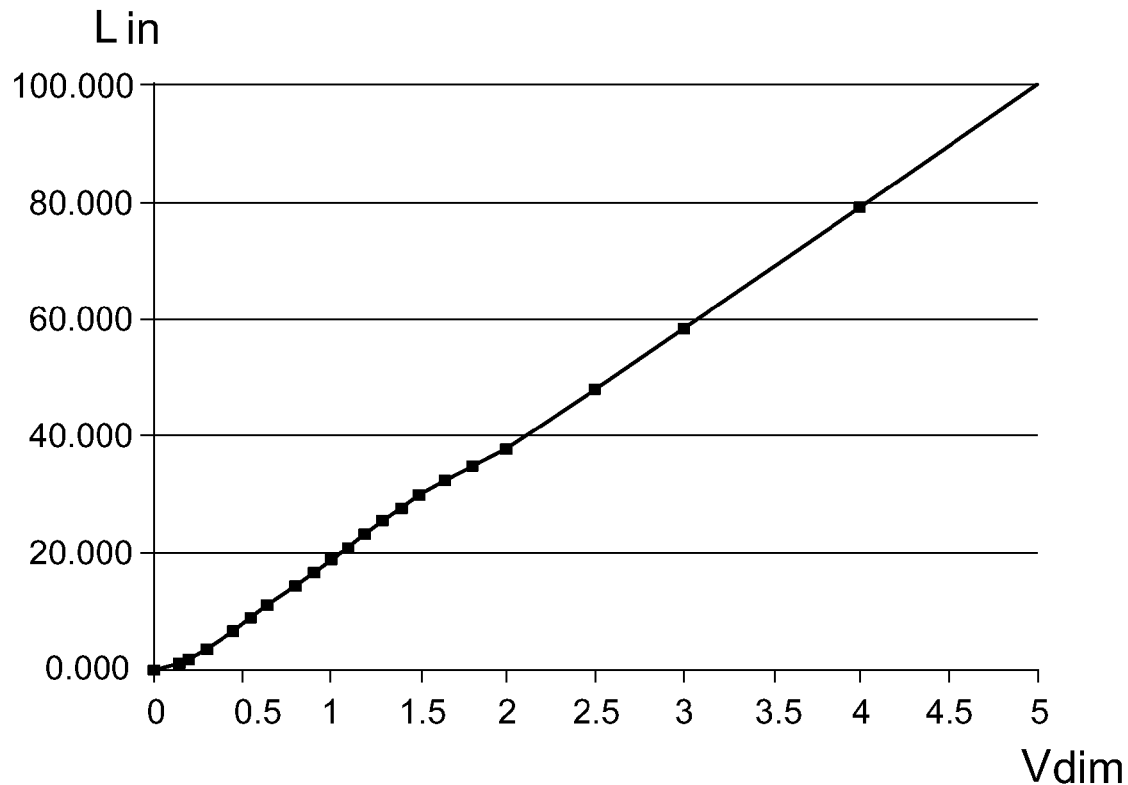
FIGS. 2a and 2b are Light Intensity Lin vs. Dimming voltage Vdim diagrams corresponding to said known control device.
Figure 2B:
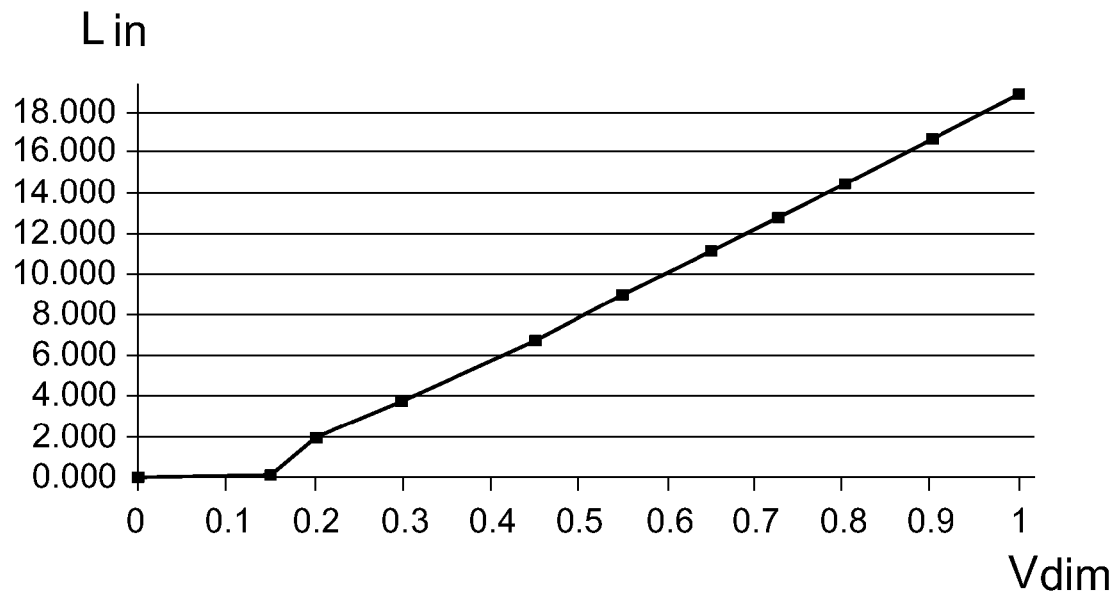

FIGS. 2a and 2b illustrate an experimentally obtained relation between the dimming voltage Vdim and the resulting light intensity level Lin (in %) in the LEDs modules of a light emitting device 11 with a control device 21 according to U.S. Pat. No. 6,935,595 and US 2009/0015436.

As shown in FIG. 2a it is a rough linear relation from 0.15V to 5V.

As shown in FIG. 2b the main problem is located at minimum light intensity control levels. The minimum intensity level obtained is 2%, which is considered a non-acceptable intensity level by pilots of receiver aircraft in night conditions.

It can also be observed how the intensity level goes to 0% when the dimming voltage Vdim is below 0.15V. It has been observed that below 0.15V an intermittent signal is generated that produces an annoying blinking of the lights that often concludes with an unexpected turning off of the light emitting device.

Figure 3:
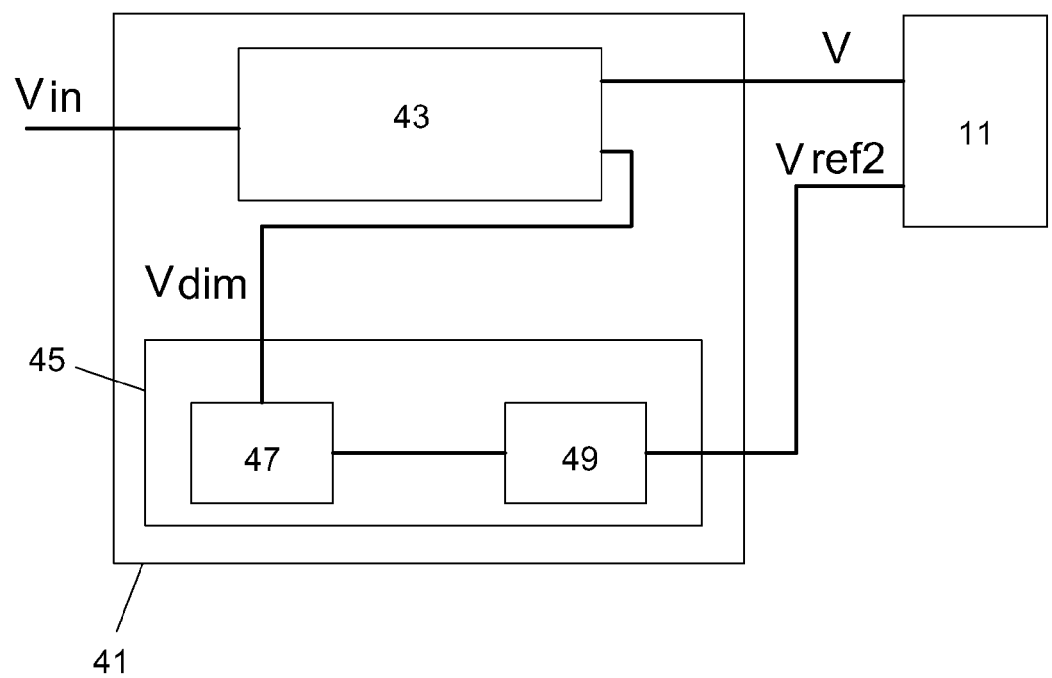
FIG. 3 is a block diagram of a control device for controlling the current supplied to a light emitting device of a guidance apparatus of a tanker aircraft according to a first embodiment of the present invention.

A control device 41 for a light emitting device 11 according to an embodiment of the invention is shown in FIG. 3.

The input to the control device 41 is an electromagnetically filtered DC voltage Vin and the output is a voltage V (e.g., +15 VDC) to be distributed to each LEDs module of the light emitting device 11 and the dimming signal Vref2 that controls the illumination level of each LEDs module of the light emitting device 11.

The control device 41 comprises a power supply interface 43 and a dimming control unit 45 comprising a dimming signal converter 47 with an exponential response and an output dimming unit 49.

The power supply interface 43 generates the voltage V and also a dimming voltage Vdim (e.g. ±5 VDC) to be sent to the dimming signal converter 47.

The output dimming unit 49 receives the converted analog voltage corresponding to the dimming voltage Vdim generated by the dimming signal converter 47 and generates a pulse-exponential amplitude modulated dimming signal Vref2 for controlling the intensity of the light emitted by the LEDs modules of the light emitting device 11.

Figure 4A:
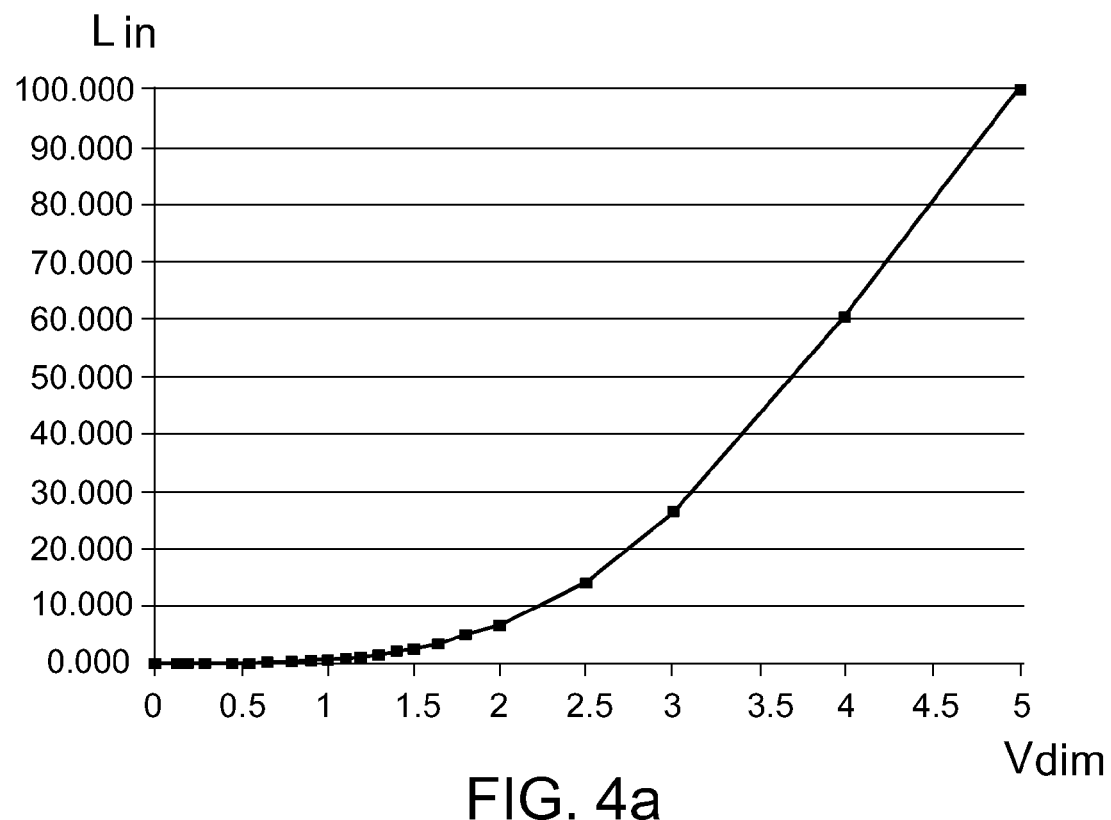
FIGS. 4a and 4b are Light Intensity Lin vs. Dimming voltage Vdim diagrams corresponding to a first embodiment of the present invention.
Figure 4B:
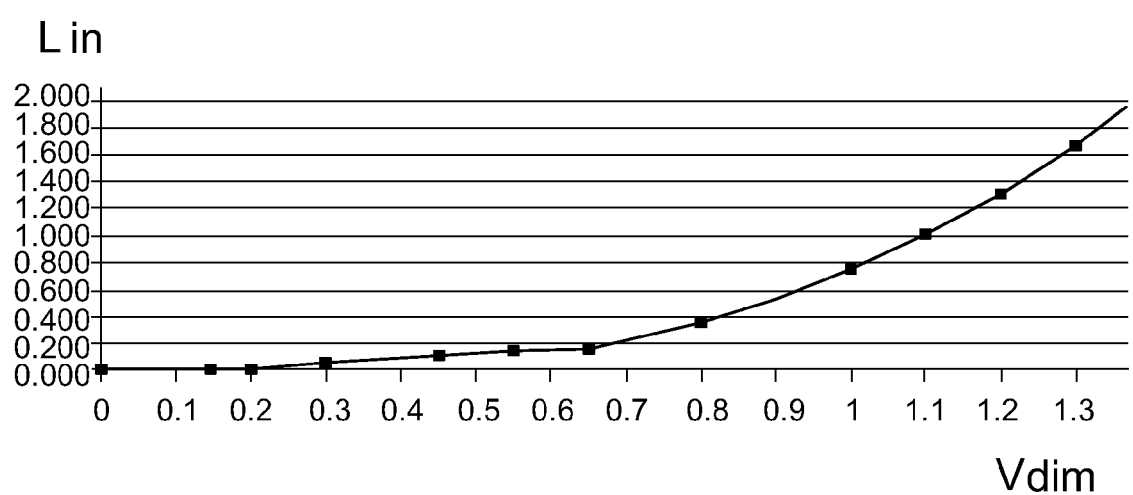

FIGS. 4a and 4b illustrate an experimentally obtained relation between the dimming voltage Vdim and the resulting intensity level Lin (in %) in the LEDs modules of a light emitting device 11 with a control device 41 according to the invention.

As shown in FIG. 4a it is an exponential relation allowing a more accurate control of the light intensity for low levels, overcoming the above-mentioned problems detected in flight when performing air to air refueling operations in night conditions.

As shown in FIG. 4b, an exponential dimming control provides to the boom operator in the tanker aircraft the capability of selecting an intensity level of the light emitting device 11 below 2%. In fact, it can be selected any value between 0 and 2%, providing the needed control levels for night conditions.

Figure 5:
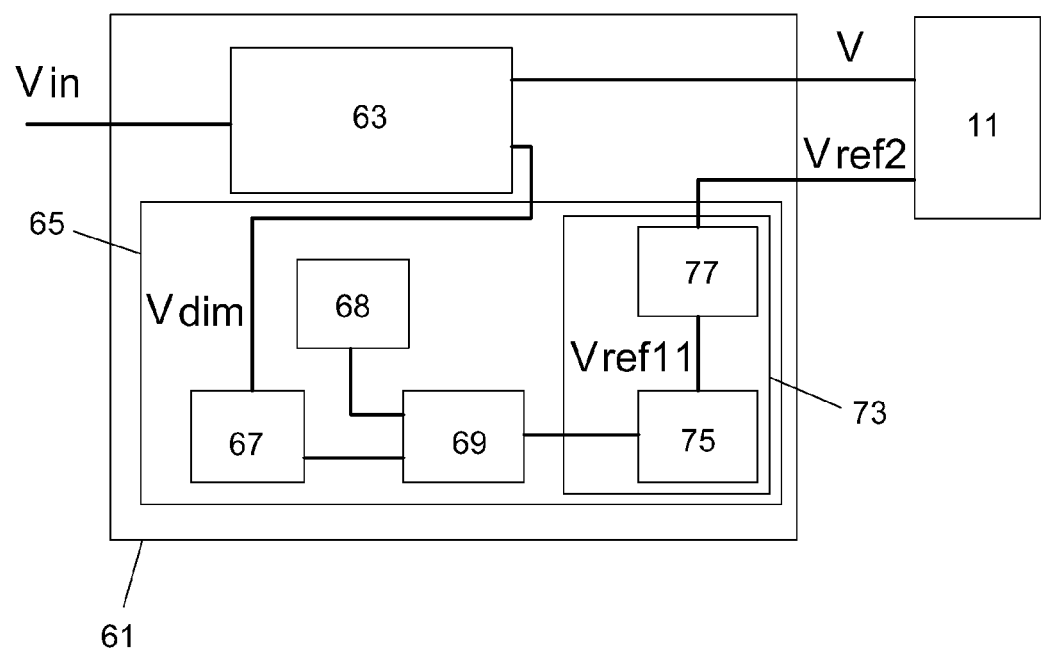
FIG. 5 is a block diagram of a control device for controlling the current supplied to a light emitting device of a guidance apparatus of a tanker aircraft according to a second embodiment of the present invention.

A control device 61 for a light emitting device 11 according to another embodiment of the invention is shown in FIG. 5.

The control device 61 comprises a power supply interface 63 and a dimming control unit 65 comprising a dimming signal converter 67, a PWM ramp generator 68, an output dimming unit 69 and an exponential dimming adapter 73.

The power supply interface 63, the dimming signal converter 67, the PWM ramp generator 68 and the output dimming unit 69 are identical to the above-mentioned power supply interface 23, dimming signal converter 27, PWM ramp generator 28 and output dimming unit 29.

The exponential dimming adapter 73 is able to receive the PWM signal Vref1 from the output dimming unit 69 and to obtain the adapted pulse-amplitude modulated signal Vref2 to be applied to the light emitting device 11.

The exponential dimming adapter 73 comprises a low pass filter 75 and an output adapter 77.

The amplitude modulation is controlled by the own PWM signal Vref1 with the aid of the low pass filter 75. The low pass filter 75 provides a voltage with an amplitude value that is proportional to the duty cycle of the PWM signal Vref1. The resulting signal Vref11 is used to control the output adapter 77, so that a low duty cycle provides a low amplitude value voltage after the filter 75, which acts over the output adapter 77 strangling the current outputted to the light emitting device 11. On the other hand, a high duty cycle provides a high amplitude value voltage after the filter 75, which acts over the output adapter 77 providing the maximum current to the light emitting device 11.

Figure 6:
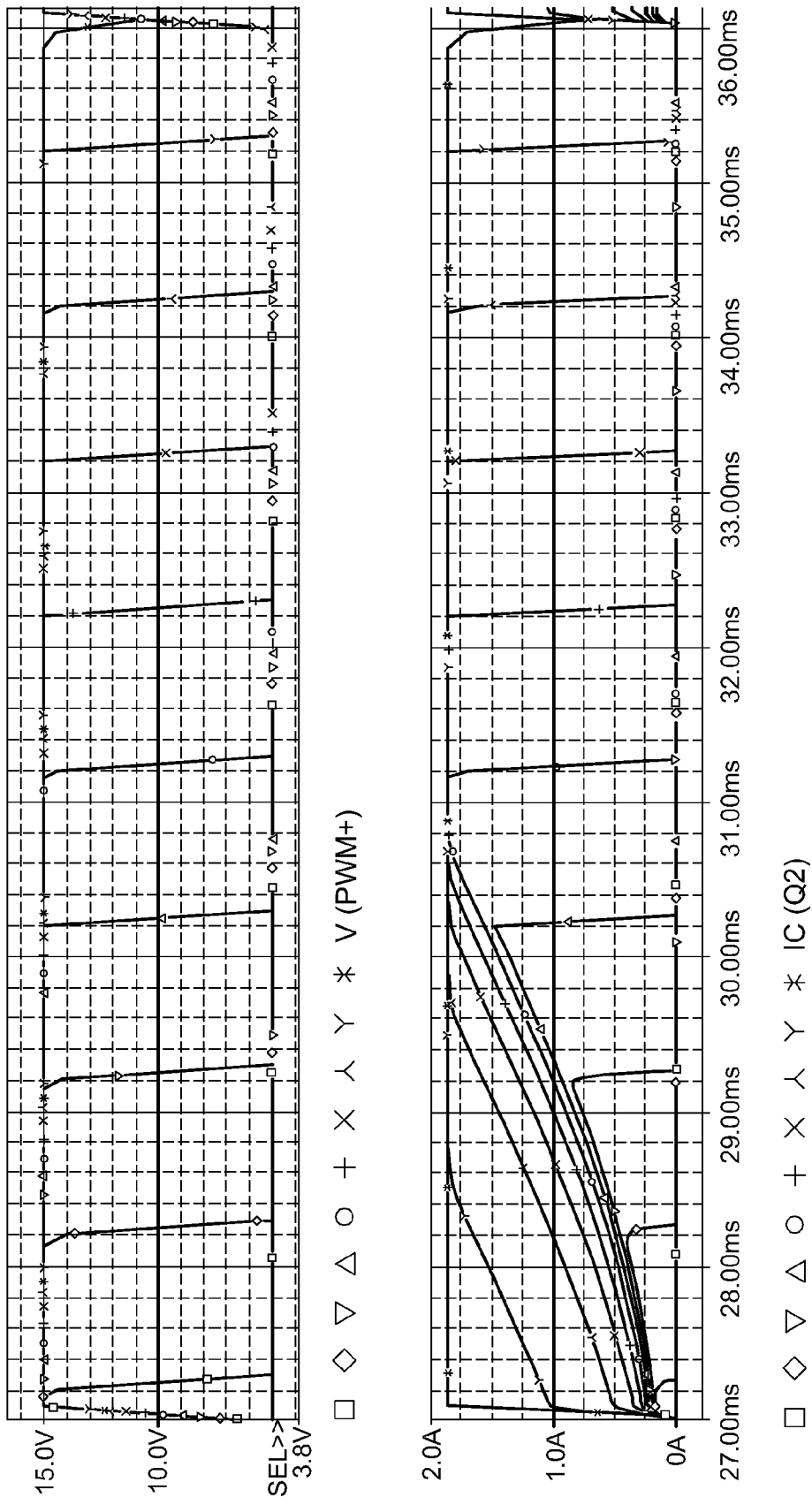
FIG. 6 shows the dimming signals generated by said known control device (upper graph) and by a control device according to the invention (lower graph).

The upper graph of FIG. 6 shows a few PWM signals from 10% to 100% of duty cycle in steps of 10%. Without the exponential dimming adapter 73, the result of applying these signals to the light emitting device is a too high intensity level at low dimming control values. The lower graph of FIG. 6 shows the resulted signal using the exponential dimming adapter 73. As shown in the lower graph, the short width pulses are amplitude modulated, reducing the control signal level to be applied to the light emitting device 11.

For highest dimming control values, the exponential dimming adapter 73 does not hardly affect the intensity level of the light emitting device 11, as the dropped voltage in the output adapter 77 is very low.

As shown in FIG. 6, the introduction of the exponential dimming adapter provides secondary advantages to the light emitting device 11: the rise and fall edges become much softer, which reduces the electromagnetic emissions and relaxes the electrical stress of the light emitting device 11 thus increasing the lifetime of the LEDs.

Although the present invention has been described in connection with various embodiments, it will be appreciated from the specification that various combinations of elements, variations or improvements therein may be made, and are within the scope of the invention.

As is apparent from the foregoing specification, the invention is susceptible of being embodied with various alterations and modifications which may differ particularly from those that have been described in the preceding specification and description. It should be understood that I wish to embody within the scope of the patent warranted hereon all such modifications as reasonably and properly come within the scope of my contribution to the art.

The invention claimed is:

1. A guidance apparatus mounted on the belly of a tanker aircraft for providing visual indications to the pilot of the receptor aircraft with respect to the approaching operation to carry out the refueling by means of a refueling boom, the guidance apparatus comprising:

light emitting devices including modules of light emitting diodes and control devices for supplying current to the light emitting diodes that include dimming control units for controlling the intensity of the light emitted by said light emitting devices by means of a dimming signal depending on a dimming voltage, the dimming control units being configured to provide to the light emitting devices a pulse-exponential amplitude modulated dimming signal in order for the pilot to properly control the light intensity in all visibility conditions, the dimming control unit comprising a dimming signal converter with an exponential response where an analog signal corresponding to the dimming voltage is generated and an output dimming unit where the pulse-exponential amplitude modulated dimming signal is generated.

2. A guidance apparatus according to claim 1, wherein the pulse-exponential amplitude modulated dimming signal is generated by using a prior generated pulse-width modulated (PWM) dimming signal corresponding to the dimming voltage.

3. A guidance apparatus according to claim 2, wherein the dimming control unit comprises a dimming signal converter, where an analog signal corresponding to the dimming voltage is generated, a PWM ramp generator and an output dimming unit that receives said analog signal as well as a signal generated by the PWM ramp generator in order to output the pulse-width modulated dimming signal and an exponential dimming adapter where the pulse-exponential amplitude modulated dimming signal is generated.

4. A guidance apparatus according to claim 3, wherein said exponential dimming adapter comprises a low pass filter and an output adapter.

5. A tanker aircraft comprising a guidance apparatus according to claim 1.

* * * * *